United States Patent
Tanaka

[19]

[11] Patent Number: 6,121,803
[45] Date of Patent: Sep. 19, 2000

[54] PULSE GENERATOR

[75] Inventor: Hitoshi Tanaka, Tokyo, Japan

[73] Assignee: Oki Electric Industry Co., Ltd., Tokyo, Japan

[21] Appl. No.: 09/255,738

[22] Filed: Feb. 23, 1999

[30]         Foreign Application Priority Data

Jun. 26, 1998  [JP]  Japan .................................. 10-180625

[51] Int. Cl.$^7$ .................................................. H03K 17/22
[52] U.S. Cl. ......................................... 327/142; 327/143
[58] Field of Search .................................. 327/142, 143, 327/198, 291, 292, 172, 175, 178

[56]              References Cited

U.S. PATENT DOCUMENTS

| | | | |
|---|---|---|---|
| 5,467,039 | 11/1995 | Bae | 327/198 |
| 5,485,111 | 1/1996 | Tanimoto | 327/143 |
| 5,552,736 | 9/1996 | Desroches | 327/198 |

FOREIGN PATENT DOCUMENTS 2-138611   5/1990   Japan .

*Primary Examiner*—Tuan T. Lam
*Assistant Examiner*—Linh Nguyen
*Attorney, Agent, or Firm*—Jones Volentine, L.L.C.

[57]               ABSTRACT

The pulse generator of the present invention comprises a p-channel type MOS transistor 5, n-channel type MOS transistors 6 and 7, and a switch circuit 8. The transistor 5 has a gate electrode coupled to a terminal n11. A voltage level of the terminal n11 is risen according to the time constant witch is decided a resistance value of a resistive element 1 and a capacitance value of a capacitive element 2, when rising a source voltage. These transistors 6 and 7 are constructed in cascade connection. The switch circuit 8 is able selective to short-circuit between one electrode and the other electrode of the transistor 7.

12 Claims, 4 Drawing Sheets

PULSE GENERATOR

BACKGROUND OF THE INVENTION

1. Field of the Invention

This invention relates to a pulse generator which generates a clock pulse according to power-on or the reset of the power after an instantaneous power failure.

2. Description of the Related Art

A semiconductor integrated circuit is used various field. Recently, portable electronics device or equipments which has the integrated circuit are spreading.

The integrated circuit is able to action variously by being applied a predetermined voltage (e.g., a source voltage). The source voltage is applied the integrated circuit according to power-on to an apparatus having the integrated circuit.

The integrated circuit has an AND gate circuit, an OR gate circuit, or flip-flop circuit. The circuit such as the flip-flop circuit needs to set a initial state. The integrated circuit has a pulse generator to set the initial state.

The pulse generator generates a pulse signal for reset according to being up the source voltage applied the integrated circuit in the apparatus after power-on for the apparatus. Generally, the pulse signal is one-shot pulse signal. The circuit such as-the flip-flop circuit is set the initial state by receiving the pulse signal. The pulse generator is able to generate the pulse signal according to the reset of the power after an instantaneous power failure. As the pluse generator, these is known one disclosed in Japanese Patent Application Laid-Open Publication No. 2-138611, for example.

Generally, the source voltage applied to the integrated circuit is 5 V. But a recent integrated circuit uses a voltage which is deferent from 5 V by the source voltage (e.g., 3 V). When the pulse generator constructed assuming that the source voltage is 5V, is applied to the integrated circuit supplied with 3V as the source voltage, a pulse width of the pulse signal is longer than a pulse width of the pulse signal by using 5V by the source voltage. As a result, the pulse generator outputs the pulse signal a long time after the source voltage has completely risen. Therefore, the time required to bring the integrated circuit into an operating state, or the time required to bring the apparatus, which has the integrated circuit, into an operating state is long.

When the pulse generator constructed assuming that the source voltage is 3V, is applied to the integrated circuit supplied with 5V as the source voltage, a voltage level of the pulse signal changes from high voltage level to low voltage level before the source voltage has completely risen. As a result, the setting initial state for the circuit such as the flip-flop circuit uncomplete.

In the constructions disclosed the above-mentioned document, it seems that the pulse generator generates the pulse signal having the full-width for low source voltage by adjusting a time constant decided a resistance value of a resistive element and a capacitance value of capacitive element. But, in the constructions disclosed the above-mentioned document, it is not able to avoid to be long the time required to bring the integrated circuit into an operating state, or to increase in area of the pulse generator by widening a size the resistive element or the capacitive element.

It is an object of the present invention to provide a pulse generator for being able to reliably generate the pulse signal even when the circuit is applied to any source voltage.

It is another object of the present invention to provide a pulse generator for avoiding an increase in area.

It is further object of the present invention to provide a pulse generator for avoiding to be long the time required to bring the integrated circuit into an operating state into an operating state.

SUMMARY OF THE INVENTION

To achieve the above invention, the pulse generator comprises a first circuit coupled between a first terminal applied the source voltage and a second terminal applied a reference voltage, the first circuit having a third terminal and a capacitive element for changing a voltage level of the third terminal according to a capacity of the capacitive element corresponding to a changing of the source voltage, a first conduction type first transistor having gate, first and second electrodes, the gate electrode thereof coupled to the third terminal, the first electrode thereof applied the source voltage, and second electrode thereof coupled to the output terminal, a second conduction type second transistor having gate, first and second electrodes, the gate electrode thereof coupled to the third terminal, the first electrode thereof coupled to the output terminal, a second circuit having n (where n: integer of n $\geq 1$) a second conduction type third transistors constructed cascade connection, each of third transistor having a gate, first and second electrode, each of the gate electrode thereof coupled to the third terminal, the first electrode of the transistor located at one end of the cascade connection coupled to the second electrode of second transistor, the other end of the cascade connection applied said reference voltage, and coupling circuit coupled between the first electrode and said second electrode of one of the third transistors for controlling an electrical connection between the first and the second electrodes.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
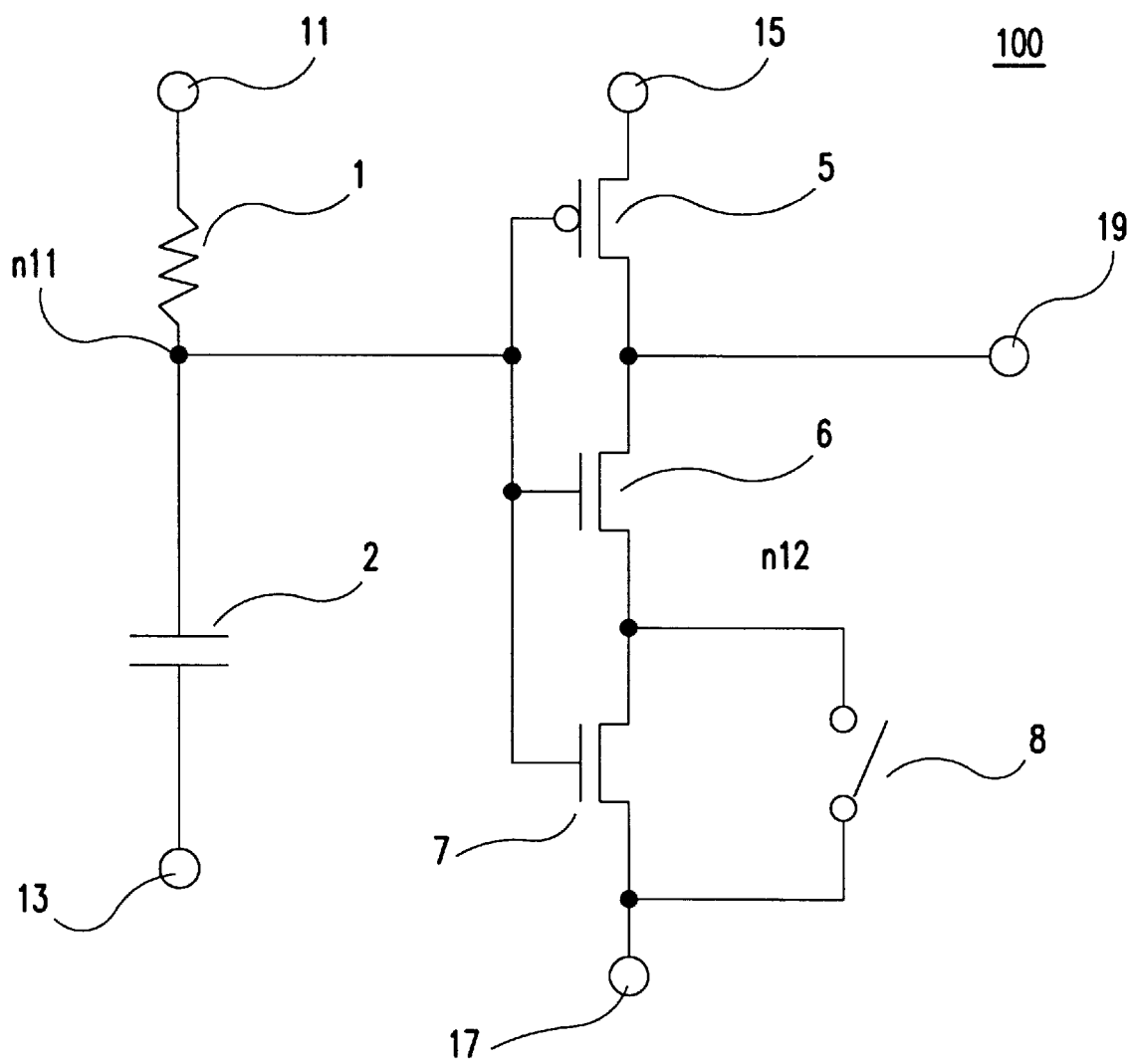
FIG. 1 is a circuit diagram illustrating a pulse generator according to the first embodiment of the present invention.

Pulse generators of the present invention will hereinafter be described with reference to the accompanying drawings. FIG. 1 is a circuit diagram of a pulse generator 100 according to a first embodiment of the present invention.

In FIG. 1, reference numeral 11 indicates a source voltage terminal used as a first terminal, to which a source voltage is applied. Similarly, reference numeral 15 also indicates a terminal to which the source voltage is applied. Reference numeral 13 indicates a reference voltage terminal used as a second terminal, to which a reference voltage is applied. Similarly, reference numeral 17 also indicates a terminal to which the reference voltage is applied. Reference numeral 19 indicates an output terminal for outputting a pulse signal corresponding to the output of the pulse generator 100.

Reference numeral 1 indicates a resistive element. One end of the resistive element 1 is electrically connected to the terminal 11, whereas the other end thereof is electrically connected to a terminal n11 used as a third terminal. Reference numeral 2 indicates a capacitor used as a capacitive element. One electrode of the capacitor 2 is electrically connected to the terminal n11, whereas the other electrode thereof is electrically connected to the terminal 13. The resistive element 1 and the capacitor 2 constitute a first circuit.

When the voltage level applied to the terminal 11 rises at power-up, for example, the capacitor 2 of the first circuit is charged by a current that flows in the resistive element 1. Therefore, the voltage level at the terminal n11 is raised with a delay from the rise in the level of the source voltage according to the time constant (=RC) determined by the resistance value (e.g., the resistance value=R) of the resistive element 1 and the capacitance (e.g., the capacitance=C) of the capacitor 2. In the present embodiment, 0V (ground voltage) is applied to the terminal 13 or 17 as the reference voltage and a voltage increased from 0V to 5V (or 3V) as the source voltage is applied to the terminal 11 or 15.

Reference numeral 5 indicates a P channel-type MOS transistor used as a first conduction-type first transistor. One electrode of the transistor 5 is electrically connected to the terminal 15, whereas the other electrode thereof is electrically connected to the output terminal 19. A gate electrode of the transistor 5 is electrically connected to the terminal n11.

Reference numeral 6 indicates an n channel-type MOS transistor used as a second conduction-type second transistor. One electrode of the transistor 6 is electrically connected to the output terminal 19, whereas the other electrode thereof is electrically connected to a second circuit to be described later. A gate electrode of the transistor 6 is electrically connected to the terminal n11.

The transistors 5 and 6 serve as an inverter operated and controlled according to the voltage level applied to the terminal n11. Namely, if the threshold values or voltages of the transistors 5 and 6 are respectively regarded as Vt, then the transistor 5 is held in a conducting state and the transistor 6 is held in a non-conducting state when the voltage level applied to the terminal n11 is less than or equal to Vt. When the voltage level applied to the terminal n11 is greater than Vt, the transistor 5 is brought to the non-conducting state and the transistor 6 is brought to the conducting state.

Reference numeral 7 indicates an n channel-type MOS transistor used as the second circuit. Although the second circuit is comprised of one transistor for simplification of illustration in FIG. 1, the second circuit may be one wherein a plurality of same conduction-type MOS transistors are constructed in cascade connection.

Now consider where the second circuit is made up of n (where n: integer of n 1) transistors, for example. When n=1, i.e., the configuration shown in FIG. 1 is taken, one electrode of the transistor 7, which constitutes the second circuit, is electrically connected to the other electrode of the transistor 6, whereas the other electrode of the transistor 7 is electrically connected to the terminal 17. A gate electrode of the transistor 7 is electrically connected to the terminal n11.

When n 2, one electrode of a 1st transistor located at one end of the cascade connection is electrically connected to the other electrode of the transistor 6, whereas the other electrode thereof is electrically connected to one electrode of a 2nd transistor. Further, one electrode of an nth transistor located at the other end of the cascade connection is electrically connected to the other electrode of an n−1th transistor, whereas the other electrode thereof is electrically connected to the terminal 17. The gate electrodes of the respective transistors are respectively electrically connected to the terminal n11. When n 3, one electrode of a kth (where k: integer of 3 k n−1) transistor located between the first and nth transistors is electrically connected to the other electrode of a k−1th transistor, whereas the other electrode thereof is electrically connected to one electrode of a k+1th transistor. Further, a gate electrode thereof is electrically connected to the terminal n11.

Since the output terminal 19 and the terminal 17 are placed in an electrically-connected state through n transistors when the transistor 6 is held in conduction, the second circuit can delay an electrical connection between the output terminal 19 and the terminal 17.

Reference numeral 8 indicates switch means 8 used a connecting circuit. The transistors, which constitute the second circuit, are respectively provided with the switch means 8 one by one. Since the second circuit is made up of one transistor 7, only one switch means 8 is illustrated in FIG. 1. One of the switch means 8 is electrically connected to one electrode of the transistor 7, whereas the other thereof is electrically connected to the other electrode of the transistor 7. When the second circuit is comprised of n transistors, the number of the switch means 8 is prepared as n. One of jth (where j: 1 j n) switch means is electrically connected to one electrode of a jth transistor, whereas the other thereof is electrically connected to the other electrode of the jth transistor. Owing to such a construction, one electrodes and the other electrodes of the respective transistors constituting the second circuit can be short-circuited according to control signals each of which controls the operation of the switch means 8.

Incidentally, the switch means 8 used as the connecting circuit may use a transistor which receives a control signal at its gate electrode. Alternatively, a fuse element may be used in place of the switch means. In this case, the connecting circuit may more preferably be constructed of the transistor because it can be formed in a manner similar to other components of the pulse generator.

Figure 2:
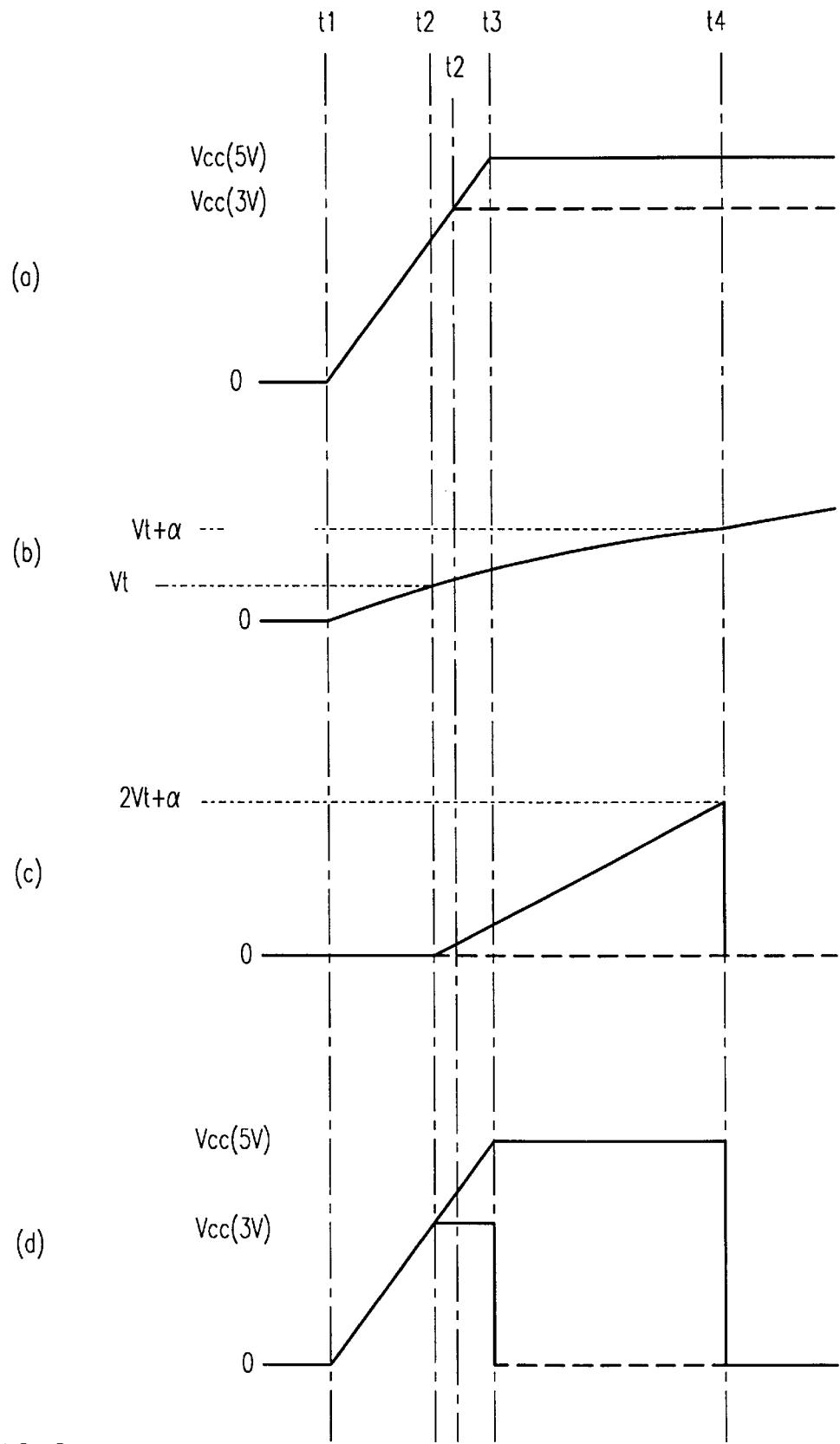
FIG. 2 is a timing chart for explaining an operation of the pulse generator shown in FIG. 1.

The operation of the pulse generator 100 constructed as described above will be described below. FIG. 2 is a timing chart for describing the operation of the pulse generator 100. FIG. 2(a) shows a voltage level at the terminal 11 or 15 supplied with the source voltage, FIG. 2(b) illustrates a voltage level at the terminal n11, FIG. 2(c) depicts a voltage level (corresponding to a voltage level at a point where the transistors 6 and 7 shown in FIG. 1 are electrically connected to each other) at a terminal n12, and FIG. 2(d) shows a voltage level at the output terminal 19, respectively. Incidentally, the pulse generator 100 will be configured assuming that the source voltage is 3V, for example. Further, the threshold voltages of the respective transistors, which constitute the pulse generator 100, will be defined as Vt respectively.

The pulse generator 100 according to the present invention is applied to a device supplied with 5V as the source voltage. In this case, the switch means 8 is set to an open state (corresponding to a state in which the terminals n12 and 17 are not short-circuited by the switch means 8 in FIG. 2) in advance.

At time t1, the source voltage Vcc starts to rise from 0V as shown in FIG. 2(a) according to power-on or the reset of the power after an instantaneous power failure. Correspondingly, the voltage level at the terminal n11 also rises from 0V. However, the voltage level at the terminal n11 is slow in rise rate as shown in FIG. 2(b) as compared with the source voltage because it is based on the time constant of the resistive element 1 and the capacitor 2.

Since the voltage level at the terminal n11 is less than the threshold voltage Vt, the transistor 5 is held in conduction and the transistors 6 and 7 are held in non-conduction. Therefore, the voltage level at the output terminal 19 rises from 0V as shown in FIG. 2(d) as the source voltage Vcc applied to the terminal 15 increases. Since the transistor 6 is held in the non-conducting state at this time, the voltage level at the terminal n12 remains at 0V as shown in FIG. 2(c).

Now consider that the voltage level at the terminal n11 reaches the threshold voltage Vt at time t2 as shown in FIG. 2(b) before the source voltage Vcc reaches a predetermined voltage (e.g., 5V) as shown in FIG. 2(a). Thus, the transistor 5 changes to the non-conducting state and the transistor 6 changes to the conducting state. Since the voltage at the terminal n12 is 0V, the transistor 7 is held in non-conduction at this time. Thus, the voltage at the terminal n12 starts to rise to a Vcc−Vt level subsequently to time t2 as shown in FIG. 2(c). Since the transistor 7 is placed in the non-conducting state, the voltage at the output terminal 19 continues to rise to the source voltage Vcc level as shown in FIG. 2(d).

Thereafter, the source voltage Vcc reaches the predetermined voltage (5V) at time t3. Thus, the voltage levels at the terminal 11 and the output terminal 19 are respectively brought to predetermined voltage levels as shown in FIGS. 2(a) and 2(d).

Thereafter, when the voltage level at the terminal n12 reaches 2Vt+α at time t4 as shown in FIG. 2(c) where the voltage level at the terminal n11 reaches Vt+α at time t4 as shown in FIG. 2(b), the transistor 7 changes from the non-conducting state to the conducting state. Therefore, the output terminal 19 and the terminal 17 are electrically held in conduction through the transistors 6 and 7. Therefore, the voltage level at the output terminal 19 results in 0V as shown in FIG. 2(d).

The pulse generator 100 according to the present invention is next applied to a device supplied with 3V as the source voltage. In this case, the switch means 8 is set to a short-circuited state (corresponding to a state in which the terminals n12 and 17 are short-circuited by the switch means 8) in advance.

Time t1 is as shown in FIG. 2. When the voltage level at the terminal n11 reaches the threshold voltage Vt at time t2, the transistor 5 changes to a non-conducting state and the transistor 6 changes to a conducting state. Since the switch means 8 is in the short-circuited state although the transistor 7 is in a non-conducting state, the output terminal 19 and the terminal 17 are electrically held in conduction through the transistor 6 and the switch means 8 at time t2. Therefore, the voltage level at the output terminal 19 is brought to 0V as indicated by a dotted line in FIG. 2(d). Since the source voltage completely rises at time t2' (as indicated by the dotted lines in FIGS. 2(a) and 2(d)) at time earlier than when the source voltage is 5V, because the source voltage is 3V, a pulse signal can be reliably outputted.

As described above, the pulse generator 100 according to the first embodiment can vary a pulse width of a pulse signal outputted from the output terminal 19 according to the state of the switch means 8. Namely, when the switch means 8 is held open, the pulse width of the outputted pulse signal can be set to a pulse width obtained between time t2 and time t4 in FIG. 2. On the other hand, when the switch means 8 is held in the short-circuited state, the pulse width thereof can be set to a pulse width obtained between time t2' and time t3 in FIG. 2.

Therefore, when the pulse generator 100 constructed assuming that the source voltage is 3V, is applied to a circuit supplied with 3V as the source voltage, the switch means 8 is set to the short-circuited state. When it is applied to a circuit supplied with a high source voltage at which the time required to cause the source voltage to rise completely becomes long, i.e., 5V as the source voltage, the switch means 8 is set to the open state. As a result, the pulse generator 100 can continue to output a pulse signal even after the source voltage has completely risen.

Conversely, when the pulse generator 100 constructed assuming that the source voltage is 5V, is applied to a circuit supplied with 5V as the source voltage, the switch means is held in the short-circuit state. Further, when it is applied to a circuit supplied with a low source voltage at which the time required to allow the source voltage to rise completely becomes short, i.e., 3V as the source voltage, the switch means 8 is held open. As a result, the pulse generator 100 can reliably operate (i.e., generate a pulse signal) even with respect to the different source voltages.

Thus, in the first embodiment, the pulse signal can be reliably generated even when the circuit is applied to any source voltage. Since the pulse width of the pulse signal outputted from the pulse generator 100 can be set according to the source voltage to be used, the time required to bring an integrated circuit into an operating state can be optimally set.

The cascade connection of the transistor 7 constituting the second circuit in plural form and the provision of the switch means 8 used as the connecting circuit in plural form according to the second circuits can cope even with any source voltage. Further, the time required to bring the integrated circuit into the operating state can be optimally set each time.

When the resistance value of the resistive element 1 and the capacitance of the capacitor 2 are increased, a larger area is required as compared with the addition of other components. However, since the first embodiment makes it unnecessary to change the resistance value of the resistive element 1 and the capacitance of the capacitor 2 according to the source voltage to be applied, an increase in area is avoided and the design and fabrication of the pulse generator are easy.

Incidentally, the resistive element and the capacitive element may be formed by a MOS resistor and a MOS capacitor respectively.

Figure 3:
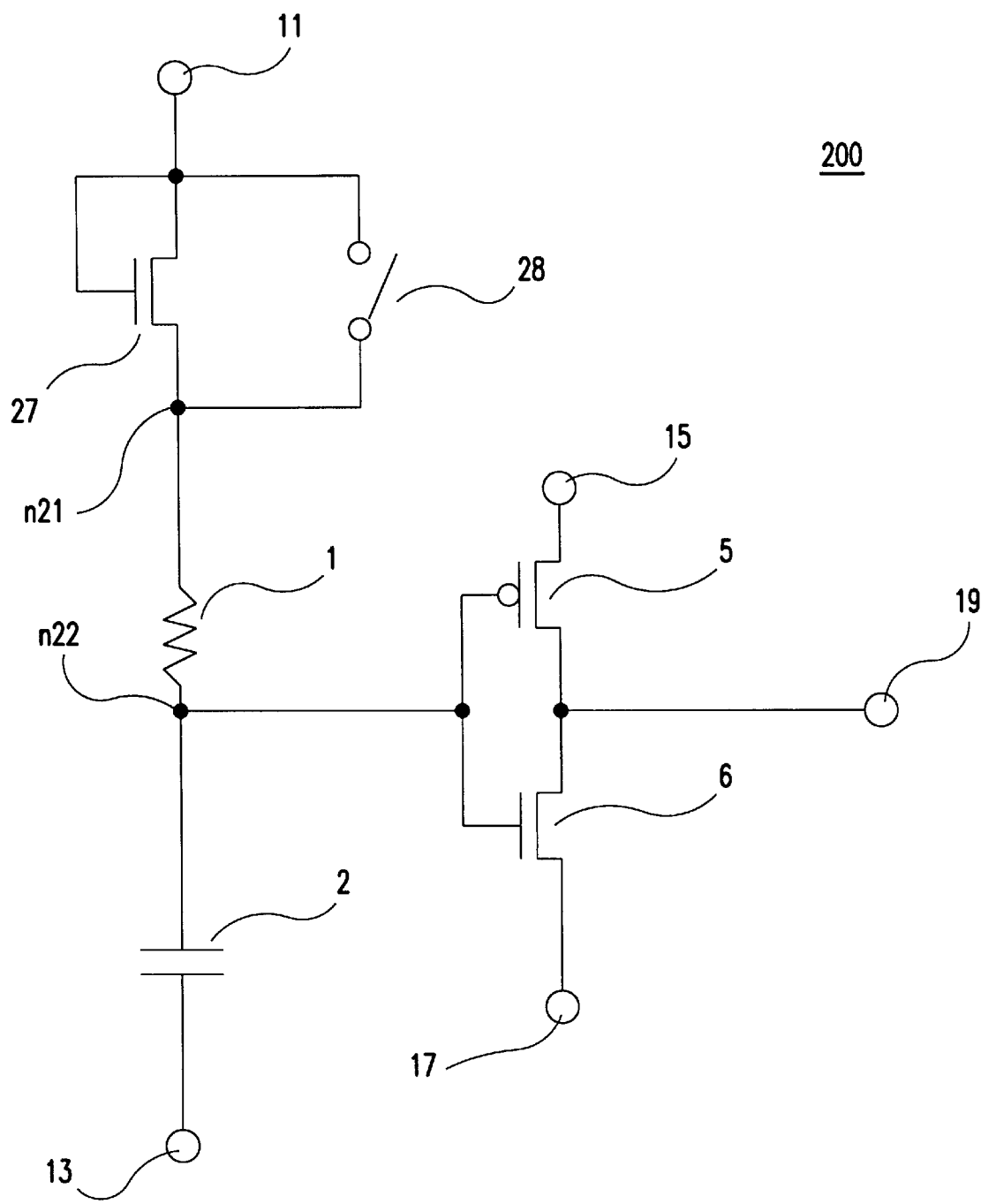
FIG. 3 is a circuit diagram illustrating a pulse generator according to the second embodiment of the present invention.

A pulse generator according to a second embodiment of the present invention will next be described below with reference to the accompanying drawings. FIG. 3 is a circuit diagram of a pulse generator 200 according to the second embodiment. In FIG. 3, the same elements of structure as those shown in the pulse generator 100 in FIG. 1 are identified by the same reference numerals.

In FIG. 3, the transistor 7 and the switch means 8 shown in FIG. 1 are omitted. In place of them, a diode-connected n channel-type MOS transistor 27 used as a diode element and switch means 28 used a connecting circuit are added to the pulse generator 200. Therefore, the other terminal of a transistor 6 is electrically connected to a terminal 17. One of a resistive element 1 is electrically connected to a terminal n21.

One electrode and a gate electrode of the transistor 27 are electrically connected to a terminal 11, whereas the other electrode thereof is electrically connected to the terminal n21. Namely, the transistor 27 operates as a diode. Incidentally, the threshold voltage of the transistor 27 will be defined as Vt in a manner similar to other transistors. One of the switch means 28 used as the connecting circuit is electrically connected to the terminal 11, whereas the other thereof is electrically connected to the terminal n21. The switch means 28 is activated so as to control a short-circuited state or open state between the terminals 11 and n21 according to a control signal.

In a manner similar to the first embodiment, the transistor 27 used as the diode element is not limited to one in number. Alternatively, a plurality of transistors may be configured in cascade connection. Switch means capable of short-circuiting or opening one terminals of diodes and the other terminals thereof may be provided for the plurality of diode-connected transistors. Further, the switch means may be comprised of a transistor whose gate electrode is supplied with a control signal or may be made up of a fuse element.

Figure 4:
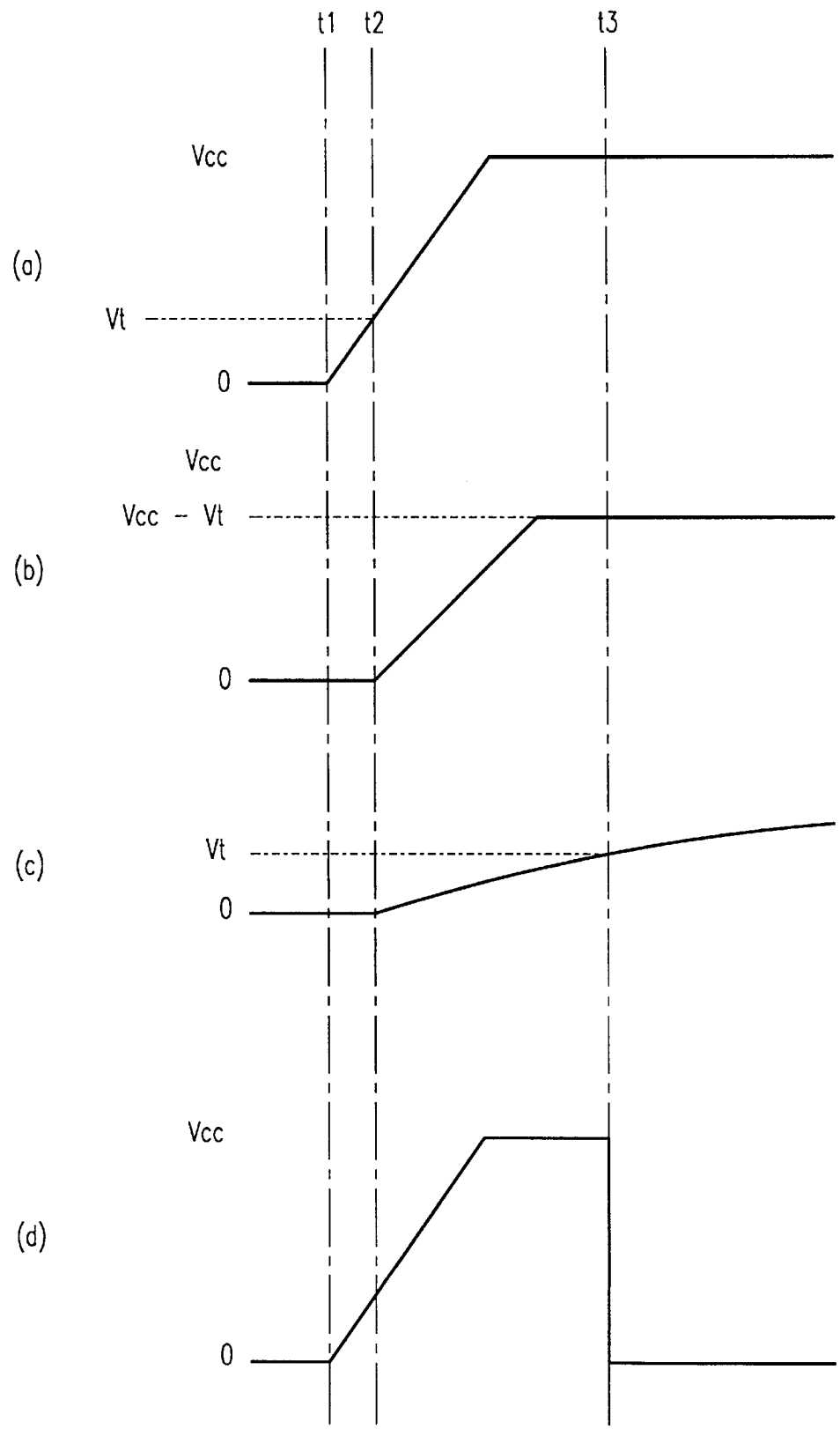
FIG. 4 is a timing chart for explaining an operation of the pulse generator shown in FIG. 3.

The operation of the pulse generator 200 shown in FIG. 3 will be described below with reference to the accompanying drawings. FIG. 4 is a timing chart for describing the operation of the pulse generator 200. FIG. 4(a) shows a voltage level at the terminal 11 or 15 supplied with a source voltage, FIG. 4(b) illustrates a voltage level at the terminal n21, FIG. 4(c) depicts a voltage level at a terminal n22, and FIG. 4(d) shows a voltage level at an output terminal 19, respectively. Incidentally, the pulse generator 200 will be configured assuming that the source voltage is 3V, for example. Further, the threshold voltages of the respective transistors, which constitute the pulse generator 200, will be defined as Vt respectively. The pulse generator 200 according to the present invention is applied to a device supplied with 5V as the source voltage. In this case, the switch means 28 is set to an open state (corresponding to a state in which the terminals n21 and 11 are not short-circuited by the switch means 28 in FIG. 3) in advance.

At time t1, the source voltage Vcc starts to rise from 0V as shown in FIG. 4(a) according to power-on or the reset of the power after an instantaneous power failure. However, when the level of the source voltage Vcc is less than the threshold voltage of the transistor 27 as shown in FIG. 4(b), the transistor 27 is held in non-conduction. Therefore, the voltage level at the terminal n21 remains at 0V. The voltage level at the terminal n22 also remains at 0V according to the voltage level at the terminal n21 (see FIG. 4(c)).

Since the voltage level at the terminal n22 is less than the threshold voltage Vt, a transistor 5 is held in conduction and the transistor 6 is held in non-conduction. Therefore, the voltage level at the output terminal 19 rises from 0V as shown in FIG. 4(d) as the source voltage Vcc applied to the terminal 15 increases.

When the level of the source voltage vcc reaches the threshold voltage Vt at time t2 as shown in FIG. 4(a), the transistor 27 is brought to a conducting state. Thus, the voltage level at the terminal n21 starts to rise from 0V as shown in FIG. 4(b). Correspondingly, the voltage level at the terminal n22 also rises from 0V. However, the voltage level at the terminal n22 is slow in rise rate as shown in FIG. 4(c) as compared with the source voltage because it is based on the time constant of the resistive element 1 and a capacitor 2.

Thereafter, the source voltage Vcc reaches a predetermined voltage level (5V) as shown in FIG. 4(a), the voltage level at the terminal n21 reaches a Vcc−Vt level as shown in FIG. 4(b), and the voltage level at the output terminal 19 reaches a Vcc level as shown in FIG. 4(d). Since the voltage level at the terminal n22 is less than the threshold voltage Vt as shown in FIG. 4(c) at this time, the transistor 5 is held in conduction and the transistor 6 is held in non-conduction.

When the voltage level at the terminal n22 reaches Vt at time t3, the transistor 5 changes to the non-conducting state and the transistor 6 changes to the conducting state. Therefore, the output terminal 19 and the terminal 17 are held in conduction through the transistor 6. Thus, the voltage level at the output terminal 19 results in 0V as shown in FIG. 4(d).

The pulse generator 200 according to the present invention is next applied to a device supplied with 3V as the source voltage. In this case, the switch means 28 is set to a short-circuited state (corresponding to a state in which the terminal 11 and the terminal n21 in FIG. 3 are short-circuited by the switch means 28) in advance.

As shown in FIG. 4(a), the source voltage Vcc starts to rise at time t1. Since the switch means 28 is placed in the short-circuited state, the voltage levels at the terminals n21 and n22 in FIGS. 4(b) and 4(c) also rise. Therefore, the voltage level at the terminal n22 reaches the threshold voltage Vt at time (before time t3 in FIG. 4) earlier than when the switch means 28 is held open. Therefore, the voltage level at the output terminal 19 also results in 0V at time (earlier than time t3) earlier than when indicated in FIG. 4(d). Incidentally, since the source voltage completely rises at time earlier than when indicated in FIGS. 4(a) and 4(d) because the source voltage is 3V, the width of an outputted pulse can be sufficiently ensured.

As described above, the pulse generator 200 according to the second embodiment can vary a pulse width of a pulse signal outputted from the output terminal 19 according to the state of the switch means 28. Namely, when the switch means 28 is held open, the pulse width of the pulse signal becomes longer than as compared with where the switch means 28 is short-circuited.

Therefore, when the pulse generator 200 constructed assuming that the source voltage is 3V, is applied to a circuit supplied with 3V as the source voltage, the switch means 28 is set to the short-circuited state. When it is applied to a circuit supplied with a high source voltage at which the time required to cause the source voltage to rise completely becomes long, i.e., 5V as the source voltage, the switch means 28 is set to the open state. As a result, the pulse generator 200 can continue to output a pulse signal even after the source voltage has completely risen.

Conversely, when the pulse generator 200 constructed assuming that the source voltage is 5V, is applied to a circuit supplied with 5V as the source voltage, the switch means is held in the short-circuit state. Further, when it is applied to a circuit supplied with a low source voltage at which the time required to allow the source voltage to rise completely becomes short, i.e., 3V as the source voltage, the switch means 28 is held open. As a result, the pulse generator 200 can reliably operate (i.e., reliably generate a pulse signal) even with respect to the different source voltages.

Thus, in the second embodiment, the pulse signal can be reliably generated even when the circuit is applied to any source voltage. Since the width of the pulse signal outputted from the pulse generator 200 can be set according to the source voltage to be used, the time required to bring an integrated circuit into an operating state can be optimally set.

The cascade connection of the transistor 27 used as the diode element in plural form and the provision of the switch means 28 used as the connecting circuit in plural form according to the number of the transistors 27 each used as the diode element can cope even with any source voltage. Further, the time required to bring an integrated circuit into an operating state can be optimally set each time.

When the resistance value of the resistive element 1 and the capacitance of the capacitor 2 are increased, a larger area is required as compared with the addition of other components. However, since the second embodiment makes it unnecessary to change the resistance value of the resistive element 1 and the capacitance of the capacitor 2 according to the source voltage to be applied, an increase in area is avoided and the design and fabrication of the pulse generator are easy.

Incidentally, the resistive element and the capacitive element may be formed by a MOS resistor and a MOS capacitor respectively when the resistance value and the capacitance may be small ones.

While the present invention has been described in detail above, the invention of the present application is not necessarily limited to the configurations of the above-described embodiments. For example, the transistor 7 and the switch means 8 employed in the first embodiment may be applied to the pulse generator according to the second embodiment. Further, the transistors 7 and 27 of the characterized pulse generators according to the two embodiments may be provided in plural form respectively and the switch means 8 and 28 thereof may be also provided in plural form respectively.

Although the embodiments have described the case in which when the plurality of (e.g., n) transistors 7 (27) are provided, the same number of (n) switch means 8 (or 28) are provided, the number of the switch means is not necessarily limited to this. For example, one switch means 8 (or 28) may be provided for two or three transistors 7 (or 27).

Further, the n channel-type transistors employed in the two embodiments may be configured as p channel-type transistors and the p channel-type transistors employed therein may be constructed as n channel-type transistors.

Thus, the present invention can be changed or modified without the scope departing from the substance of the invention.

What is claimed is:

1. A pulse generator for generating a clock pulse from an output terminal according to a source voltage, said pulse generator comprising:

a first circuit coupled between a first terminal which receives the source voltage and a second terminal which receives a reference voltage, said first circuit having a third terminal and a capacitive element connected between the third terminal and the second terminal, said first circuit for changing a voltage level of the third terminal according to a capacity of the capacitive element corresponding to a changing of the source voltage;

a first conduction type first transistor having a gate and first and second electrodes, the gate electrode thereof coupled to the third terminal, the first electrode thereof receiving the source voltage, and the second electrode thereof coupled to the output terminal;

a second conduction type second transistor having a gate and first and second electrodes, the gate electrode thereof coupled to the third terminal, and the first electrode thereof coupled to the output terminal;

a second circuit having n second conduction type third transistors configured in a cascade connection, wherein n≧1, each of said third transistors having a gate and first and second electrodes, wherein the gate electrode of each third transistor is coupled to the third terminal, the first electrode of one of said third transistors located at one end of the cascade connection is coupled to the second electrode of said second transistor, and the second electrode of one of said third transistors located at the other end of the cascade connection receives the reference voltage; and a coupling circuit coupled between the first electrode and the second electrode of one of said third transistors for controlling an electrical connection between the first and the second electrodes.

2. A pulse generator for generating a clock pulse from an output terminal according to a source voltage, said pulse generator comprising:

a diode element having first and second electrodes, the first electrode thereof coupled to a first terminal receiving the source voltage;

a first circuit coupled between the second electrode of said diode element and a second terminal which receives a reference voltage, said first circuit having a third terminal and a capacitive element connected between the third terminal and the second terminal, said first circuit for changing a voltage level of the third terminal according to a capacity of the capacitive element corresponding to a changing of a voltage level of the second electrode of said diode element;

a first conduction type first transistor having a gate and first and second electrodes, the gate electrode thereof coupled to the third terminal, the first electrode thereof receiving the source voltage, and the second electrode thereof coupled to the output terminal;

a second conduction type second transistor having a gate and first and second electrodes, the gate electrode thereof coupled to said third terminal, the first electrode thereof coupled to said output terminal, and the second electrode receiving said reference voltage;

a coupling circuit coupled between said first and said second electrodes of said diode element for controlling an electrical connection between the first and the second electrodes of the diode element.

3. A pulse generator according to claim 1, said first circuit further comprising a resistive element coupled between said first and said third terminals.

4. A pulse generator according to claim 2, said first circuit further comprising a resistive element coupled between said second electrode of said diode element and said third terminal.

5. A pulse generator according to claim 1, said coupling circuit further comprising a fuse element.

6. A pulse generator according to claim 2, said coupling circuit further comprising a fuse element.

7. A pulse generator according to claim 3, said coupling circuit further comprising a fuse element.

8. A pulse generator according to claim 4, said coupling circuit further comprising a fuse element.

9. A pulse generator according to claim 1, said coupling circuit further comprising a switching element for controlling an electrical connection according to a control signal.

10. A pulse generator according to claim 2, said coupling circuit further comprising a switching element for controlling an electrical connection according to a control signal.

11. A pulse generator according to claim 3, said coupling circuit further comprising a switching element for controlling an electrical connection according to a control signal.

12. A pulse generator according to claim 4, said coupling circuit further comprising a switching element for controlling an electrical connection according to a control signal.

* * * * *